United States Patent
Williams

(10) Patent No.: US 9,471,880 B2
(45) Date of Patent: Oct. 18, 2016

(54) SYSTEMS AND METHODS FOR INTERACTING WITH A QUANTUM COMPUTING SYSTEM

(71) Applicant: D-WAVE SYSTEMS INC., Burnaby (CA)

(72) Inventor: Colin P. Williams, Half Moon Bay, CA (US)

(73) Assignee: D-Wave Systems Inc., Burnaby (CA)

( * ) Notice: Subject to any disclaimer, the term of this patent is extended or adjusted under 35 U.S.C. 154(b) by 293 days.

(21) Appl. No.: 14/250,041

(22) Filed: Apr. 10, 2014

(65) Prior Publication Data

US 2014/0337612 A1     Nov. 13, 2014

Related U.S. Application Data

(60) Provisional application No. 61/811,457, filed on Apr. 12, 2013.

(51) Int. Cl.
*G06N 99/00* (2010.01)
*G06F 17/00* (2006.01)

(52) U.S. Cl.
CPC .................................. *G06N 99/002* (2013.01)

(58) Field of Classification Search
None
See application file for complete search history.

(56) References Cited

U.S. PATENT DOCUMENTS

| | | |
|---|---|---|
| 7,135,701 B2 | 11/2006 | Amin et al. |
| 7,418,283 B2 | 8/2008 | Amin |
| 7,533,068 B2 | 5/2009 | Maasen van den Brink et al. |
| 7,619,437 B2 | 11/2009 | Thom et al. |
| 7,639,035 B2 | 12/2009 | Berkley |
| 7,870,087 B2 | 1/2011 | Macready et al. |
| 7,876,248 B2 | 1/2011 | Berkley et al. |
| 7,898,282 B2 | 3/2011 | Harris et al. |
| 7,984,012 B2 | 7/2011 | Coury et al. |
| 8,008,942 B2 | 8/2011 | van den Brink et al. |
| 8,035,540 B2 | 10/2011 | Berkley et al. |

(Continued)

FOREIGN PATENT DOCUMENTS

WO     2012/064974 A2     5/2012

OTHER PUBLICATIONS

Williams, "Systems and Methods for Interacting With a Quantum Computing System," U.S. Appl. No. 61/811,457, filed Apr. 12, 2013, 55 pages.

*Primary Examiner* — Stanley K Hill
*Assistant Examiner* — Mikayla Chubb
(74) *Attorney, Agent, or Firm* — Seed IP Law Group PLLC

(57) ABSTRACT

Systems and methods that employ interactions between quantum computing systems and digital computing systems are described. For an iterative method, a quantum computing system may be designed, operated, and/or adapted to provide a rate of convergence that is greater than the rate of convergence of a digital supercomputer. When the digital supercomputer is iteratively used to evaluate an objective function at a cost incurred of C per iteration, the quantum computing system may be used to provide the input parameter(s) to the objective function and quickly converge on the input parameter(s) that optimize the objective function. Thus, a quantum computing system may be used to minimize the total cost incurred $C_T$ for consumption of digital supercomputer resources when a digital supercomputer is iteratively employed to evaluate an objective function.

25 Claims, 8 Drawing Sheets

(56) References Cited

U.S. PATENT DOCUMENTS

| | | |
|---|---|---|
| 8,190,548 B2 | 5/2012 | Choi |
| 8,195,596 B2 | 6/2012 | Rose et al. |
| 8,195,726 B2 | 6/2012 | Macready et al. |
| 8,283,943 B2 | 10/2012 | van den Brink et al. |
| 8,421,053 B2 | 4/2013 | Bunyk et al. |
| 8,464,542 B2 | 6/2013 | Hilton et al. |
| 8,494,993 B2 | 7/2013 | Harris et al. |
| 2007/0239366 A1 | 10/2007 | Hilton et al. |
| 2013/0117200 A1* | 5/2013 | Thom .............. G06Q 40/06 705/36 R |
| 2013/0282636 A1 | 10/2013 | Macready et al. |
| 2014/0025606 A1 | 1/2014 | Macready |
| 2014/0187427 A1* | 7/2014 | Macready .......... G06N 99/002 505/170 |

\* cited by examiner

SYSTEMS AND METHODS FOR INTERACTING WITH A QUANTUM COMPUTING SYSTEM

BACKGROUND

1. Field

The present systems and methods generally relate to interacting with quantum computing systems, and particularly relate to interactions between quantum computing systems and digital computing systems.

2. Quantum Computing Systems

A quantum computing system is any computing system that employs a quantum processor. A quantum processor is any computer processor that is designed to leverage at least one quantum mechanical phenomenon (such as superposition, entanglement, tunneling, etc.) in the processing of quantum information. Many different designs for quantum processor hardware exist, including but not limited to: photonic quantum processors, superconducting quantum processors, nuclear magnetic resonance quantum processors, ion-trap quantum processors, topological quantum processors, quantum dot quantum processors, etc. Regardless of the specific hardware implementation, all quantum processors encode and manipulate quantum information in quantum mechanical objects or devices called quantum bits, or "qubits;" all quantum processors employ structures or devices for communicating information between qubits; and all quantum processors employ structures or devices for reading out a state of at least one qubit. The physical form of the qubits depends on the hardware employed in the quantum processors; e.g., photonic quantum processors employ photon-based qubits, superconducting quantum processors employ superconducting qubits, and so on.

Quantum processors may be architected to operate in a variety of different ways. For example, a quantum processor may be architected as a general-purpose processor or as a special-purpose processor, and/or may be designed to perform gate/circuit-based algorithms or adiabatic/annealing-based algorithms. Exemplary systems and methods for quantum processors are described in, for example: U.S. Pat. No. 7,135,701, U.S. Pat. No. 7,418,283, U.S. Pat. No. 7,533,068, U.S. Pat. No. 7,619,437, U.S. Pat. No. 7,639,035, U.S. Pat. No. 7,898,282, U.S. Pat. No. 8,008,942, U.S. Pat. No. 8,190,548, U.S. Pat. No. 8,195,596, U.S. Pat. No. 8,283,943, and US Patent Application Publication 2011-0022820 (also see U.S. Pat. No. 8,421,053), each of which is incorporated herein by reference in its entirety.

A quantum computing system (including a quantum processor) may interact with another computing system, such as a digital computing system. Throughout this specification and the appended claims, the term "digital computing system" and variants thereof are used to denote any "classical" or "non-quantum" computing system that performs digital processing tasks. Exemplary systems and methods for interactions between a quantum computing system and a digital computing system are described in, for example: US Patent Publication 2007-0239366, U.S. Pat. No. 7,984,012, U.S. Pat. No. 8,195,726, U.S. Pat. No. 7,870,087, U.S. patent application Ser. No. 13/300,169 (now US Patent Application Publication 2014-0025606), and U.S. patent application Ser. No. 13/806,404 (now US Patent Application Publication 2013-0282636), each of which is incorporated herein by reference in its entirety.

Digital Supercomputer

Throughout this specification and the appended claims, the term "digital supercomputer" is used to describe a high-performance digital computing system that employs a large number of digital processors (e.g., on the order of 10,000, 100,000, or more digital processors) configured in either a distributed network (e.g., grid computing, cloud computing, etc.) or in a localized computer cluster. A digital supercomputer typically far exceeds the performance of a state-of-the-art personal computer in at least one metric. For example, a digital supercomputer may be able to perform a large number of floating point operations per second (FLOPS), such as on the order of TFLOPS (i.e., $10^{12}$ FLOPS), PFLOPS (i.e., $10^{15}$ FLOPS), or more. For example, a digital supercomputer may have more memory, input bandwidth and/or output bandwidth.

There are many computational tasks which are beyond the capabilities of typical personal computers and which require a digital supercomputer in order to be completed. Examples include applications with many variables (e.g., on the order of hundreds of variables or more) and/or involving optimization, simulation, modeling, etc. Due to their immense computational resources, digital supercomputers are relatively scarce (compared to, for example, personal computers) and can be expensive to operate. A user of a digital supercomputer is typically charged (i.e., billed) according to the amount of time for which the digital supercomputer resources are used (which may be measured in a variety of different ways, including wall-clock time, total measured FLOPs, computation time, etc.). In many cases, the cost of operating a digital supercomputer is prohibitive and a potential user who cannot afford the computational resources of a digital supercomputer is forced to simplify a computational task to an approximation that can be completed using more affordable computational resources. Thus, there is a need in the art for systems and/or methods for optimizing the use of digital supercomputer systems so that, for example, the cost of completing a computational task is reduced.

Rate of Convergence in Iterative Methods

In an iterative method, such as an iterative method of optimizing a function or otherwise solving an optimization problem, multiple candidate "solutions" may be determined in series over multiple iterations. For example, a first candidate solution may be determined in a first iteration and a second candidate solution may be determined in a second iteration. In most iterative methods, successive candidate solutions are compared to the "best known solution so far" and a new candidate solution may replace the existing "best known solution so far" if it represents an improvement over the existing "best known solution so far." For example, a first candidate solution from a first iteration may be cast as the "best known solution so far," and if a second candidate solution from a second iteration is better than the first candidate solution than the second candidate solution may replace the first candidate solution as the "best known solution so far." Therefore, the "quality" of the "best known solution so far" (e.g., how close the best known solution so far is to the "overall best" solution, or global optimum) may, on average, improve over successive iterations. In some cases, information about the existing "best known solution so far" may be used to influence the new candidate solutions generated in subsequent iterations. The rate of improvement in the quality of the "best known solution so far" may depend on many factors, but ultimately the "best known solution so far" may converge on the "overall best" solution. Throughout this specification and the appended claims, the term "rate of convergence" refers to the rate at which the quality of candidate solutions provided by a system or method (e.g., the quality of the "best known solution so far") converges on the quality of the overall best solution, or global optimum. Different algorithmic approaches to optimization may be characterized by their rate of convergence.

Throughout this specification and the appended claims, the term "solution" is generally used to refer to a parameter for which a "good enough" value is determined when an optimal value is sought. In many cases, a sub-optimal value that nevertheless satisfies some solution criterion is considered to be an acceptable solution. Similarly, the term "optimized" is used throughout this specification and the appended claims to refer to a solution or function that has been through an optimization process to determine a value that satisfies at least one solution criterion. Depending on the nature of the problem or function being studied, the "solution" may correspond to a specific output (e.g., an optimized value of an objective function) or a specific input or configuration of inputs (e.g., an optimized value of at least one input parameter of a function).

BRIEF SUMMARY

A method of minimizing a total cost incurred for consumption of digital supercomputer resources when a digital supercomputer is employed to optimize a function, wherein the digital supercomputer evaluates the function in response to a call from an external computing system, each call to the digital supercomputer from the external computing system having a cost incurred per call, may be summarized as including initializing communication between the digital supercomputer and the external computing system, wherein the external computing system includes a quantum computing system; optimizing the function, wherein optimizing the function comprises, for a plurality iterations: generating a candidate value for at least one input parameter by the quantum computing system, transmitting, in a respective call, the candidate value for at least one input parameter from the quantum computing system to the digital supercomputer, and evaluating the function based on the candidate value for at least one input parameter by the digital supercomputer, until a value for at least one input parameter that at least approximately optimizes the function is found, wherein the number of iterations in the plurality of iterations is dependent on a rate of convergence of the quantum computing system, and wherein the rate of convergence of the quantum computing system is greater than a rate of convergence of the digital supercomputer such that the number of iterations is minimized, and wherein the total cost incurred is minimized; and in response to finding the value for at least one input parameter that at least approximately optimizes the function: stopping the iteration, and returning the found value for at least one input parameter that at least approximately optimizes the function by the digital supercomputer.

Generating a candidate value for at least one input parameter by the quantum computing system may include performing at least one of adiabatic quantum computation and quantum annealing by the quantum computing system. Transmitting the candidate value for at least one input parameter from the quantum computing system to the digital supercomputer may include transmitting the candidate value for at least one input parameter from the quantum computing system to the digital supercomputer by at least one of: a direct electrical connection, a wireless connection, a remote connection, or an Internet connection. The number of iterations in the plurality iterations may be greater than one, and optimizing the function may further include, for at least one iteration: providing feedback to the external computing system from the digital supercomputer based on evaluating the function based on the candidate value for at least one input parameter by the digital supercomputer, wherein feedback from an current one of the iterations may influence generating a candidate value for at least one input parameter by the quantum computing system in a next one of the iterations. The number of iterations in plurality iterations may be upper bounded by a value selected from a group consisting of: 1000, 100, and 10. Generating a candidate value for at least one input parameter by the quantum computing system may include generating multiple candidate values for the at least one input parameter by the quantum computing system, and may further include, for each iteration of the plurality of iterations: selecting a candidate value for the at least one input parameter from the multiple candidate values for the at least one input parameter by the external computing system. Selecting a candidate value for the at least one input parameter from the multiple candidate values for the at least one input parameter by the external computing system may include selecting a candidate value for the at least one input parameter that occurs most frequently among the multiple candidate values for the at least one input parameter by the external computing system. Generating a candidate value for at least one input parameter by the quantum computing system may include generating respective candidate values for multiple input parameters by the quantum computing system.

A hybrid computing system that optimizes a function based on at least one input parameter may be summarized as including: a quantum computing system that generates candidate values for the at least one input parameter, wherein the quantum computing system has a first rate of convergence; and a digital supercomputer that evaluates the function based on the at least one input parameter, wherein the digital supercomputer has a second rate of convergence, and wherein for a plurality of iterations: the quantum computing system generates a candidate value for the at least one input parameter, the quantum computing system calls the digital supercomputer to transmit the candidate value for the at least one input parameter to the digital supercomputer, and the digital supercomputer evaluates the function based on the candidate value for the at least one input parameter, until a value for the at least one input parameter that at least approximately optimizes the function is found, wherein the number of calls to the digital supercomputer from the quantum computing system is dependent on the first rate of convergence of the quantum computing system, and wherein the first rate of convergence of the quantum computing system is greater than the second rate of convergence of the digital supercomputer such that the number of calls to the digital supercomputer from the quantum computing system is minimized; and in response to finding the value for the at least one input parameter that at least approximately optimizes the function: the digital supercomputer returns the found value for the at least one input parameter that at least approximately optimizes the function.

The quantum computing system may include a superconducting quantum processor, and the quantum computing system may generate candidate values for the at least one input parameter by at least one of adiabatic quantum computation and quantum annealing. The quantum computing system and the digital supercomputer may be communicatively coupleable by at least one of a direct electrical connection, a wireless connection, a remote connection, and an Internet connection.

A method of operating both a quantum computing system and a digital supercomputer to at least approximately optimize a function based on at least one input parameter may be summarized as including, for a number of iterations: generating a candidate value for at least one input parameter by the quantum computing system; programming the digital supercomputer with the candidate value for at least one input parameter; and evaluating the function based on the candidate value for at least one input parameter by the digital supercomputer, until a value for at least one input parameter that at least approximately optimizes the function is found, wherein the number of iterations is dependent on a rate of convergence of the quantum computing system, and wherein the rate of convergence of the quantum computing system is greater than a rate of convergence of the digital supercomputer; and in response to finding a value for at least one input parameter that at least approximately optimizes the function: stopping the iteration; and returning the found value for at least one input parameter that at least approximately optimizes the function by the digital supercomputer.

Generating a candidate value for at least one input parameter by the quantum computing system may include performing at least one of adiabatic quantum computation and quantum annealing by the quantum computing system.

The method of operating both a quantum computing system and a digital supercomputer to at least approximately optimize a function based on at least one input parameter may further include, for at least one iteration: providing feedback to the quantum computing system from the digital supercomputer based on evaluating the function based on the candidate value for at least one input parameter by the digital supercomputer, wherein feedback from an $i^{th}$ iteration may influence generating a candidate value for at least one input parameter by the quantum computing system in an $(i+1)^{th}$ iteration.

The number of iterations may be selected from a group consisting of: a number less than 1000, a number less than 100, and a number less than 10. Generating a candidate value for at least one input parameter by the quantum computing system may include generating multiple candidate values for the at least one input parameter by the quantum computing system, and may further include, for each of the number of iterations: selecting a candidate value for the at least one input parameter from the multiple candidate values for the at least one input parameter by a digital computing system. Selecting a candidate value for the at least one input parameter from the multiple candidate values for the at least one input parameter by a digital computing system may include selecting a candidate value for the at least one input parameter that occurs most frequently among the multiple candidate values for the at least one input parameter by the digital computing system. Generating a candidate value for at least one input parameter by the quantum computing system may include generating respective candidate values for multiple input parameters by the quantum computing system.

A method of iteratively operating a hybrid computing system to solve a problem, the hybrid computing system comprising a quantum computing system having a first rate of convergence and a digital computing system having a second rate of convergence, wherein the quantum computing system and the digital computing system are in communication with one another and the first rate of convergence of the quantum computing system is greater than the second rate of convergence of the digital computing system may be summarized as including, for a number of iterations: generating a candidate solution to the problem by the quantum computing system; and evaluating the candidate solution to the problem by the digital computing system, until a candidate solution to the problem that satisfies at least one solution criterion is found, wherein the number of iterations is dependent on the first rate of convergence of the quantum computing system; and in response to finding a candidate solution to the problem that satisfies at least one solution criterion: stopping the iteration; and returning the found candidate solution that satisfies at least one solution criterion by the digital computing system.

Generating a candidate solution to the problem by the quantum computing system may include performing at least one of adiabatic quantum computation and quantum annealing by the quantum computing system.

The method of iteratively operating a hybrid computing system to solve a problem may further include, for at least one iteration, providing feedback to the quantum computing system from the digital computing system based on evaluating the candidate solution to the problem by the digital computing system, wherein feedback from an $i^{th}$ iteration may influence generating a candidate solution to the problem by the quantum computing system in an $(i+1)^{th}$ iteration.

The number of iterations may be selected from a group consisting of: a number less than 1000, a number less than 100, and a number less than 10. Generating a candidate solution to the problem by the quantum computing system may include generating multiple candidate solutions to the problem by the quantum computing system, and may further include, for each of the number of iterations: selecting a candidate solution to the problem from the multiple candidate solutions to the problem by the digital computing system. Selecting a candidate solution to the problem from the multiple candidate solutions to the problem by the digital computing system may include selecting a candidate solution to the problem that occurs most frequently among the multiple candidate solutions to the problem by the digital computing system. The problem may include optimizing a function based on at least one input parameter and wherein: generating a candidate solution to the problem by the quantum computing system may include generating a candidate value for at least one input parameter by the quantum computing system; and evaluating the candidate solution to the problem by the digital computing system may include evaluating the function based on the candidate value for at least one input parameter by the digital computing system.

A hybrid computing system may be summarized as including: a cryogenic refrigeration system that provides a refrigerated environment; a superconducting quantum processor positioned within the refrigerated environment and cooled by the cryogenic refrigeration system; and a superconducting digital processor positioned within the refrigerated environment and cooled by the cryogenic refrigeration system, wherein the superconducting digital processor is superconductively coupled to the superconducting quantum processor.

The cryogenic refrigeration system may include a dilution refrigerator thermally coupled to both the superconducting quantum processor and the superconducting digital processor.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

FIG. 1 is a schematic diagram of a portion of an exemplary superconducting quantum processor designed for AQC (and/or quantum annealing) that may be used in the present systems and methods FIG. 2 is an illustrative graph showing a comparison between the rate of convergence of a quantum computing system and the rate of convergence of a digital computing system in accordance with the present systems and methods.

DETAILED DESCRIPTION

Figure 1:
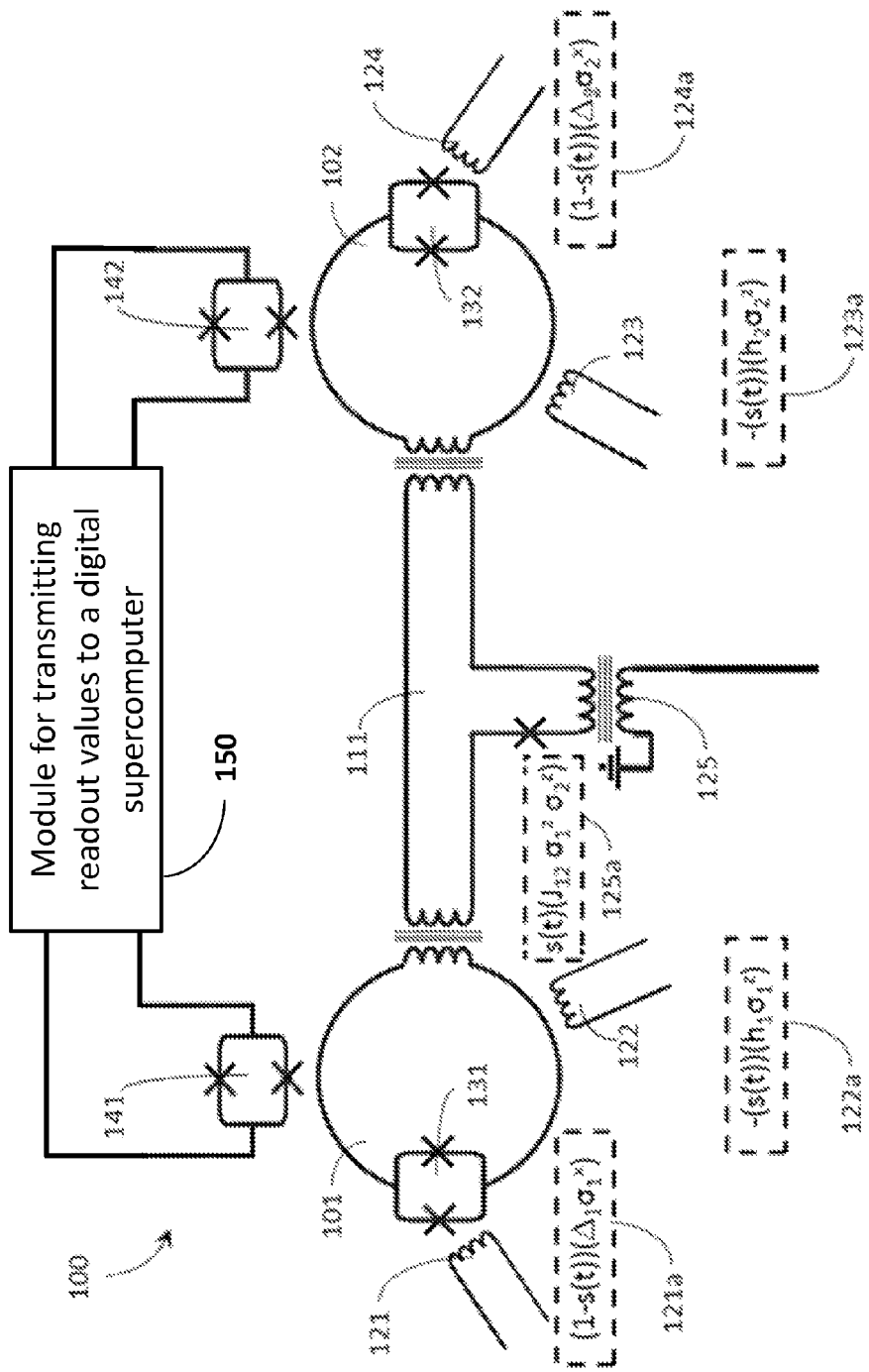

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with quantum processors, such as quantum devices, coupling devices, and control systems including microprocessors, drive circuitry and non-transitory computer- or processor-readable media such as nonvolatile memory for instance read only memory (ROM), electronically erasable programmable ROM (EEPROM) or FLASH memory, etc., or volatile memory for instance static or dynamic random access memory (ROM) have not been shown or described in detail to avoid unnecessarily obscuring descriptions of the embodiments of the present systems and methods. Throughout this specification and the appended claims, the words "element" and "elements" are used to encompass, but are not limited to, all such structures, systems and devices associated with quantum processors, as well as their related programmable parameters.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment," or "an embodiment," or "another embodiment" means that a particular referent feature, structure, or characteristic described in connection with the embodiment is included in at least one embodiment. Thus, the appearances of the phrases "in one embodiment," or "in an embodiment," or "another embodiment" in various places throughout this specification are not necessarily all referring to the same embodiment. Furthermore, the particular features, structures, or characteristics may be combined in any suitable manner in one or more embodiments.

It should be noted that, as used in this specification and the appended claims, the singular forms "a," "an," and "the" include plural referents unless the content clearly dictates otherwise. Thus, for example, reference to a problem-solving system including "a quantum processor" includes a single quantum processor, or two or more quantum processors, including a grid or distributed network of multiple quantum processors. It should also be noted that the term "or" is generally employed in its sense including "and/or" unless the content clearly dictates otherwise.

The headings provided herein are for convenience only and do not interpret the scope or meaning of the embodiments.

The various embodiments described herein provide systems and methods for interacting with quantum computing systems. For example, the present systems and methods describe optimizing the use of a digital supercomputer by interacting with the digital supercomputer by a quantum computing system.

As previously described, a quantum computing system may include a quantum processor, and quantum processors may come in many different forms. As an illustrative example, a superconducting quantum processor designed to perform adiabatic quantum computation and/or quantum annealing is used in the description that follows. However, as previously described, a person of skill in the art will appreciate that the present systems and methods may be applied to any form of quantum processor hardware (e.g., superconducting, photonic, ion-trap, quantum dot, topological) implementing any form of quantum algorithm(s) (e.g., adiabatic quantum computation, quantum annealing, gate/circuit-based quantum computing).

Adiabatic quantum computation typically involves evolving a system from a known initial Hamiltonian (the Hamiltonian being an operator whose eigenvalues are the allowed energies of the system) to a final Hamiltonian by gradually changing the Hamiltonian. A simple example of an adiabatic evolution is a linear interpolation between initial Hamiltonian and final Hamiltonian.

$$H_e = (1-s)H_{In} + sH_f \tag{1}$$

where $H_{In}$ is the initial Hamiltonian, $H_f$ is the final or "problem" Hamiltonian, $H_e$ is the evolution or instantaneous Hamiltonian, and s is the evolution coefficient which controls the rate of evolution. In general, s may vary from 0 to 1 with time t as s(t). A common approach to adiabatic quantum computation ("AQC"), described, for example, in M.H.S. Amin, 2008 "Effect of local minima on quantum adiabatic optimization", *Physical Review Letters*, Vol. 100, 130503, is to start with an initial Hamiltonian of the form shown in Equation 2:

$$H_{In} = -\frac{1}{2}\sum_{i=1}^{N}\Delta_i\sigma_i^x \tag{2}$$

where N represents the number of qubits, $\sigma_i^x$ is the Pauli x-matrix for the $i^{th}$ qubit and $\Delta_i$ is the single qubit tunnel splitting induced in the i$^{th}$ qubit. Here, the $\sigma_i^x$ terms are examples of "off-diagonal" terms. An initial Hamiltonian of this form may, for example, be evolved to a final Hamiltonian of the form:

$$H_f = -\frac{\varepsilon}{2}\left[\sum_{i=1}^{N} h_i \sigma_i^z + \sum_{i,j=1}^{N} J_{ij}\sigma_i^z\sigma_j^z\right] \quad (3)$$

where N represents the number of qubits, $\sigma_i^z$ is the Pauli z-matrix for the i$^{th}$ qubit, $h_i$ and $J_{ij}$ are dimensionless local fields coupled into each qubit and the couplings between qubits, and $\varepsilon$ is some characteristic energy scale for $H_f$. Here, the $\sigma_i^z$ and $\sigma_i^z\sigma_j^z$ terms are examples of "diagonal" terms. Throughout this specification, the terms "final Hamiltonian" is used but "problem Hamiltonian" is a suitable term since the final Hamiltonian encodes the problem of interest. Hamiltonians such as $H_{In}$ and $H_f$ in Equations 2 and 3, respectively, may be physically realized in a variety of different ways. A particular example is realized by an implementation of superconducting qubits.

FIG. 1 is a schematic diagram of a portion of an exemplary superconducting quantum processor 100 designed for quantum annealing and/or adiabatic quantum computing that may be used in the present systems and methods. An alternative term for superconducting quantum processor 100 is superconducting quantum processor. The portion of superconducting quantum processor 100 shown in FIG. 1 includes two superconducting qubits 101, 102 and a tunable diagonal coupler 111 coupling information therebetween providing pair-wise coupling between qubits 101 and 102). While the portion of quantum processor 100 shown in FIG. 1 includes only two qubits 101, 102 and one coupler 111, those of skill in the art will appreciate that quantum processor 100 may include any number of qubits and any number of coupling devices coupling information therebetween.

The portion of quantum processor 100 shown in FIG. 1 may be implemented to physically realize QA and/or AQC by initializing the system with the Hamiltonian described by Equation 2 and evolving the system to the Hamiltonian described by Equation 3 in accordance with the evolution described by Equation 1. Quantum processor 100 includes a plurality of interfaces 121-125 that are used to configure and control the state of quantum processor 100. Each of interfaces 121-125 may be realized by a respective inductive coupling structure, as illustrated, as part of a programming subsystem and/or an evolution subsystem. Such a programming subsystem and/or evolution subsystem may be separate from quantum processor 100, or it may be included locally (i.e., on-chip with quantum processor 100) as described in, for example, U.S. Pat. No. 7,876,248 and U.S. Pat. No. 8,035,540.

In the operation of quantum processor 100, interfaces 121 and 124 may each be used to couple a flux signal into a respective compound Josephson junction 131, 132 of qubits 101 and 102, thereby controlling the $\Delta_i$ terms in the system Hamiltonian. This coupling provides the off-diagonal $\sigma^x$ terms of the Hamiltonian described by Equation 2 and these flux signals are examples of "disordering signals." Similarly, interfaces 122 and 123 may each be used to couple a flux signal into a respective qubit loop of qubits 101 and 102, thereby realizing the $h_i$ terms in the system Hamiltonian. This coupling provides the diagonal $\sigma^z$ terms of Equation 3. Furthermore, interface 125 may be used to couple a flux signal into coupler 111, thereby realizing the $J_{ij}$ term(s) in the system Hamiltonian. This coupling provides the diagonal $\sigma_i^z\sigma_j^z$ terms of Equation 3. In FIG. 1, the contribution of each of interfaces 121-125 to the system Hamiltonian is indicated in boxes 121a-125a, respectively. Thus, throughout this specification and the appended claims, the terms "problem formulation" and "configuration of a number of programmable parameters" are used to refer to, for example, a specific assignment of $h_i$ and $J_{ij}$ terms in the system Hamiltonian of a superconducting quantum processor by, for example, interfaces 121-125.

In the context of quantum processor 100, the term "programming subsystem" is used to generally describe the interfaces (e.g., "programming interfaces" 122, 123, and 125) used to apply the programmable parameters (e.g., the $h_i$ and $J_{ij}$ terms) to the programmable elements of quantum processor 100 and other associated control circuitry and/or instructions. As previously described, the programming interfaces of the programming subsystem may communicate with other subsystems which may be separate from the quantum processor or may be included locally on the processor. Similarly, in the context of quantum processor 100, the term "evolution subsystem" is used to generally describe the interfaces (e.g., "evolution interfaces" 121 and 124) used to evolve the programmable elements of quantum processor 100 and other associated control circuitry and/or instructions. For example, the evolution subsystem may include annealing signal lines and their corresponding interfaces (121, 124) to the qubits (101, 102).

Quantum processor 100 also includes readout devices 141 and 142, where readout device 141 is configured to read out the state of qubit 101 and readout device 142 is configured to read out the state of qubit 102. In the embodiment shown in FIG. 1, each of readout devices 141 and 142 comprises a respective DC-SQUID that is configured to inductively couple to the corresponding qubit (qubits 101 and 102, respectively). In the context of quantum processor 100, the term "readout subsystem" is used to generally describe the readout devices 141, 142 used to read out the final states of the qubits (e.g., qubits 101 and 102) in the quantum processor to produce a bit string. The readout subsystem may also include other elements, such as routing circuitry (e.g., latching elements, a shift register, or a multiplexer circuit) and/or may be arranged in alternative configurations (e.g., an XY-addressable array, an XYZ-addressable array, etc.). Qubit readout may also be performed using alternative circuits, such as that described in PCT Patent Application Publication 2012-064974. In accordance with the present systems and methods, readout devices 141 and 142 are coupled to a "module for transmitting readout values to a digital supercomputer" 150. A module, or a program module, is a set of processor readable instructions. Module 150 may receive readout values from readout devices 141 and 142, store these values, and transmit these values to a digital supercomputer for the purpose of using the digital supercomputer to evaluate an objective function based on the readout values (as described in much greater detail later on). Module 150 may also perform the "selecting a candidate value from a plurality of candidate values" tasks described later, for example, at act 302 of method 300 from FIG. 3, act 402 of method 400 from FIG. 4, and/or act 503 of method 500 from FIG. 5.

While FIG. 1 illustrates only two physical qubits 101, 102, one coupler 111, and two readout devices 141, 142, a quantum processor (e.g., processor 100) may employ any number of qubits, couplers, and/or readout devices, including a larger number (e.g., hundreds, thousands or more) of qubits, couplers and/or readout devices. The application of the teachings herein to processors with a different (e.g., larger) number of computational components should be readily apparent to those of ordinary skill in the art.

At least some of the devices illustrated in FIG. 1 are simplified in order to enhance clarity. As an example, the structure of the qubits (101, 102) and the interface to the readout devices (141, 142) are simplified in FIG. 1 in order to reduce clutter. While the simplified circuits of quantum processor 100 may be sufficient for some applications, a quantum processor may employ qubit circuits and/or readout schemes that are considerably more complicated than those which are illustrated in FIG. 1.

In accordance with the present systems and methods, a quantum computing system may be designed, operated, and/or adapted to provide a particular rate of convergence in an iterative method. For example, when operated iteratively to optimize a function, a quantum processor may be designed to employ quantum mechanical effects that cannot be employed by digital processors in order to achieve a rate of convergence that is greater than that which can be achieved by digital processors. Exemplary quantum mechanical effects that can be employed by a quantum processor but cannot be employed as a computational resource by a digital processor include, but are not limited to: quantum tunneling, quantum superposition, and quantum entanglement. In some instances, a quantum computing system and a digital computing system may both be operated, separately, to produce substantially the same result to a problem (e.g., substantially the same result when optimizing a function). However, in accordance with the present systems and methods, the greater convergence rate of the quantum computing system compared to that of the digital computing system may enable the quantum computing system to produce the same result in fewer iterations. Producing substantially the same result in fewer iterations can be of tremendous value in situations where the cost of computational resources depends on the number of iterations used, such as for example, in the use of digital supercomputer resources.

Figure 2:
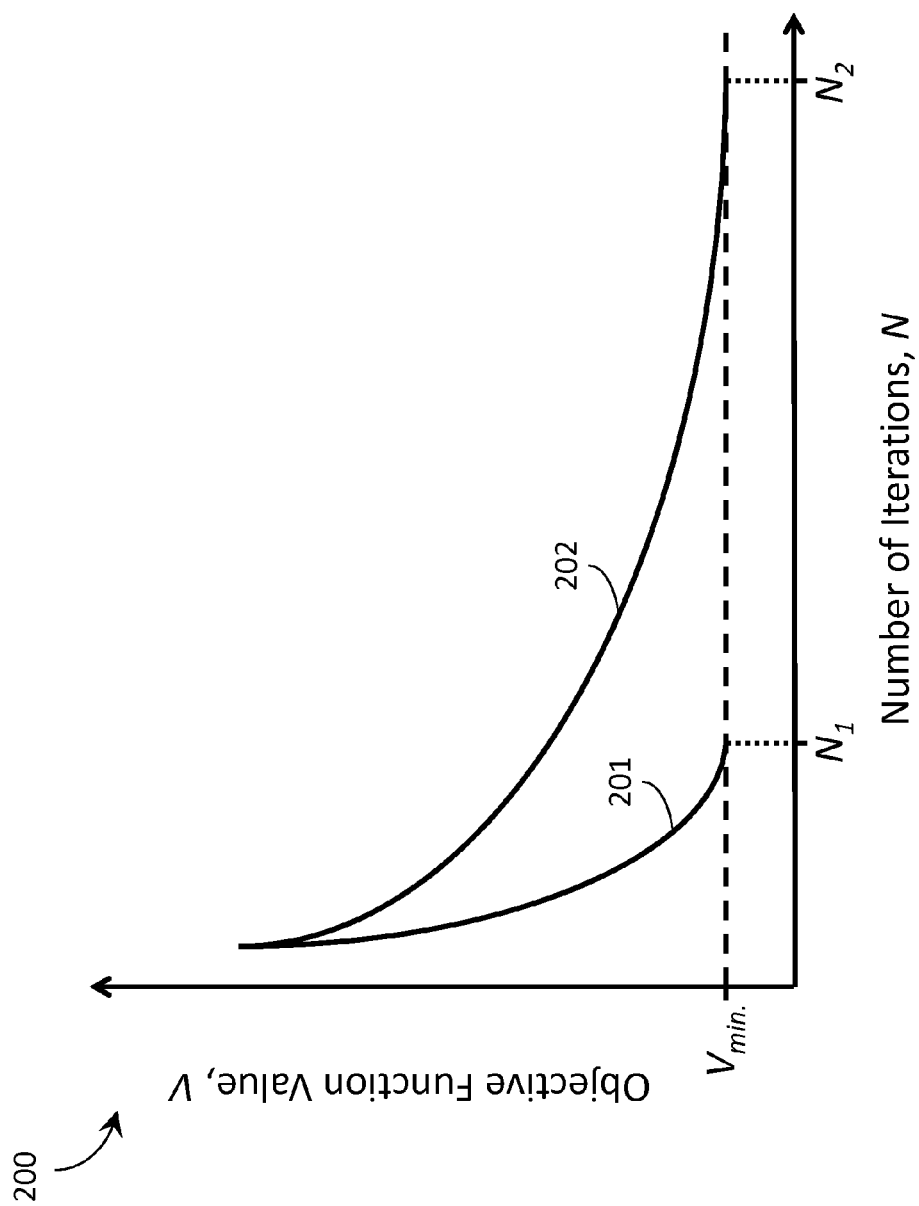

FIG. 2 is an illustrative graph 200 showing a comparison between the rate of convergence of a quantum computing system and the rate of convergence of a digital computing system in accordance with the present systems and methods. Graph 200 represents an iterative computational task in which the minimum of an objective function is sought (i.e., a minimization problem). The value of the objective function V is plotted on the y-axis of graph 200 with V decreasing from top to bottom. The minimum value is denoted by $V_{min}$. The number of iterations N is plotted on the x-axis of graph 200 with N increasing from left to right. Curve 201 represents the value V of the "best solution known so far" for the quantum computing system at each iteration N, while curve 202 similarly represents the value V of the "best solution known so far" for the digital computing system at each iteration N. Curves 201 and 202 are approximately based on actual tests comparing the convergence rate of a superconducting quantum processor (similar to processor 100 from FIG. 1 but employing over 500 superconducting qubits) performing quantum annealing to the convergence rate of an Intel Xeon CPU E5-2609 digital processor operated at 2.40 GHz with 16 GB of RAM performing tabu search. For the tests, over 5,000 random instances of 502 variable problems specified to 1-bit of precision (i.e., $h_i$, $J_{ij} = \pm 1$) were run for 10 seconds on both the quantum processor and the digital processor. As previously described, the quantum computing system is designed, operated, and/or adapted to provide a greater rate of convergence than the digital computing system. The greater rate of convergence of the quantum computing system compared to the digital computing system manifests itself in the greater magnitude of the average slope of curve 201 compared to that of curve 202. In the illustrative example of graph 200, both the quantum computing system and the digital computing system ultimately determine the same value, $V_{min}$, as the solution to the minimization problem; however, because the magnitude of the average slope of curve 201 is greater than that of curve 202, curve 201 reaches $V_{min}$ at $N_1$ whereas curve 202 reaches $V_{min}$ at $N_2$. $N_1$ is less than $N_2$, thus the greater rate of convergence of the quantum computing system compared to the digital computing system enables the quantum computing system to determine $V_{min}$ in fewer iterations than the digital computing system.

In some applications, the optimization (e.g., minimization) of an objective function may involve determining a value of at least one input parameter (or the respective values of multiple input parameters) of the objective that produces an optimal (e.g., minimum) output from the objective function. Such applications may be considered as comprising two computational tasks: i) the computational task of determining a value of at least one input parameter that optimizes the objective function, and ii) the computational task of evaluating the objective function given the value of the at least one input parameter. Either or both of these tasks may be computationally difficult. For example, some applications may involve an objective function that is best-suited to be evaluated by a digital supercomputer. An example of such an objective function is one that models or simulates a complicated system, such as a weather model, a model of a vehicular system such as an automobile or an airplane, a model of a biological or chemical system, etc. The evaluation of such an objective function may benefit from the extensive computational resources afforded by a digital supercomputer; however, the use of a digital supercomputer to evaluate such an objective function can be prohibitively expensive, particularly if the number of iterations required is high.

A digital supercomputer (or any digital computing system) may similarly be employed to perform the computational task of determining a value of at least one input parameter that optimizes the objective function. The number of iterations N required in order to optimize the objective function would then be dependent on the rate of convergence of the digital supercomputer. Referring again to graph 200 from FIG. 2, if a digital supercomputer is used to determine a value of at least one input parameter that optimizes the objective function (i.e., a value of at least one input parameter that yields $V_{min}$ when the objective function is evaluated based on the value of the at least one input parameter), then, as a result of the limited rate of convergence of the digital supercomputer, the optimization of the objective function would follow curve 202 and would be expected to take $N_2$ iterations. Of particular relevance to the present systems and methods, if a digital supercomputer is used to determine a value of at least one input parameter that optimizes the objective function, then the optimization of the objective function would require $N_2$ evaluations of the objective function by the digital supercomputer. In practice, each evaluation of the objective function (i.e., for a given value of at least one input parameter) may have a "cost incurred per call" C for consumption of digital supercomputer resources. The "total cost incurred" $C_T$ for evaluating the objective function by the digital supercomputer is then given by a value proportional to the product of the number of evaluations and the cost incurred per call. For example, $C_T=N_2*C$.

In accordance with the present systems and methods, the total cost incurred $C_T$ for consumption of digital supercomputer resources in optimizing an objective function may be minimized by using a quantum computing system to determine the value of at least one input parameter that optimizes the objective function. Referring again to graph 200 from FIG. 2, if a quantum computing system is used to determine a value of at least one input parameter that optimizes the objective function (while the digital supercomputer is still used to evaluate the objective function given the value of the at least one input parameter), then, as a result of the greater rate of convergence of the quantum computing system, the optimization of the objective function would follow curve 201 and would be expected to take $N_1$ iterations. The optimization of the objective function would then require only $N_1$ evaluations of the objective function by the digital supercomputer and the total cost incurred $C_T$ for consumption of digital supercomputer resources would be given by $C_T=N_1*C<N_2*C$.

In some instances, a quantum computing system may not be particularly well-suited to perform the computational task of evaluating an objective function based on the value of at least one input parameter. Such may be true, for example, of a quantum computing system that is designed to perform a different specialized task, such as adiabatic quantum computing, quantum annealing, or sampling as described in U.S. patent application Ser. No. 13/806,404 (now US Patent Application Publication 2013-0282636). In both of the scenarios described above (i.e., using a digital supercomputer to determine the value of at least one input parameter that optimizes an objective function versus using a quantum computing system to determine the value of at least one input parameter that optimizes the objective function), the digital supercomputer is used to evaluate the objective function based on the "best known" value of the at least one input parameter at each iteration. Thus, using a quantum computing system that is designed, operated, and/or adapted to determine a value of at least one input parameter that optimizes an objective function with a greater rate of convergence than a digital supercomputer can significantly reduce the total cost incurred $C_T$ for consumption of digital supercomputer resources because the greater rate of convergence of the quantum computing system leads to fewer evaluations of the objective function by the digital supercomputer.

Figure 3:
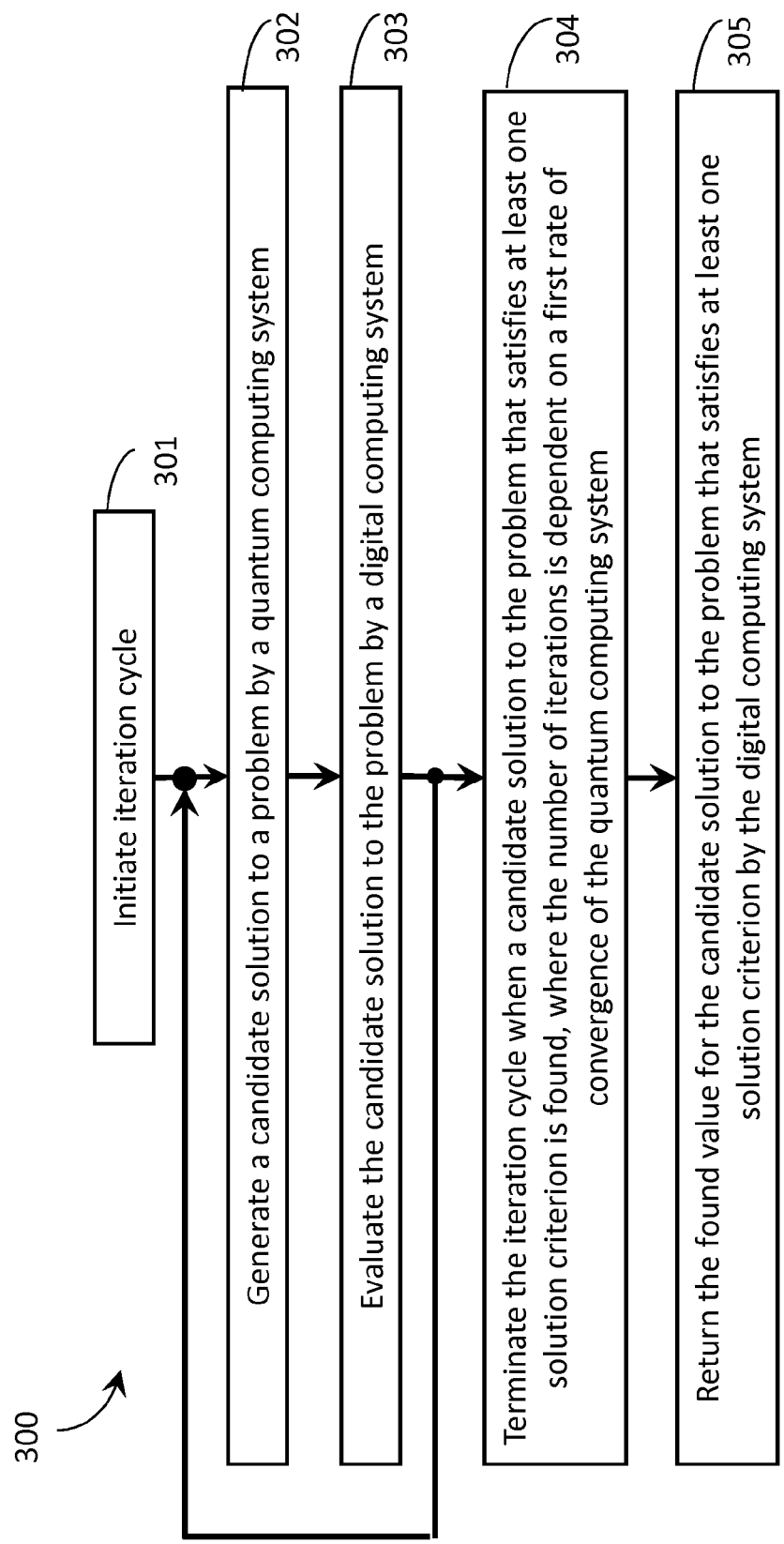
FIG. 3 is a flow-diagram showing a method of iteratively operating a hybrid computing system to solve a problem in accordance with the present systems and methods.

FIG. 3 is a flow-diagram showing a method 300 of iteratively operating a hybrid computing system to solve a problem in accordance with the present systems and methods. The hybrid computing system comprises a quantum computing system having a first rate of convergence and a digital computing system having a second rate of convergence, where the quantum computing system and the digital computing system are in communication with one another and the first rate of convergence of the quantum computing system is greater than the second rate of convergence of the digital computing system. Method 300 includes five acts 301-305, though those of skill in the art will appreciate that in alternative embodiments certain acts may be omitted and/or additional acts may be added. Those of skill in the art will appreciate that the illustrated order of the acts is shown for exemplary purposes only and may change in alternative embodiments.

At 301, an iteration cycle is initiated. The iteration cycle may continue for any number N of iterations including millions of iterations, thousands of iterations, fewer than 1000 iterations, fewer than 100 iterations, and/or fewer than 10 iterations. Acts 302 and 303 are completed for each iteration. At 302, a candidate solution to the problem is generated by the quantum computing system. Generating a candidate solution to the problem by the quantum computing system may include performing at least one of adiabatic quantum computation and/or quantum annealing. At 303, the candidate solution to the problem is evaluated by the digital computing system. The digital computing system may include a digital supercomputer and each evaluation of a candidate solution by the digital supercomputer may have a "cost incurred per call" C for consumption of digital supercomputer resources. The "total cost incurred" $C_T$ for consumption of digital supercomputer resources is then a value proportional to the product of the number of evaluations and the cost incurred per call. For example, given by $C_T=N*C$. At 304, the iteration cycle is terminated when a candidate solution to the problem that satisfies at least one solution criterion is found. The total number of iterations N is dependent on the first rate of convergence of the quantum computing system. As previously described, since the first rate of convergence of the quantum computing system is greater than the second rate of convergence of the digital computing system (e.g., including a digital supercomputer), generating candidate solutions to the problem by the quantum computing system (i.e., act 302) can significantly reduce the total number of iterations in method 300 and thereby significantly reduce the total cost incurred $C_T$ for consumption of digital supercomputer resources at act 303. Accordingly, method 300 provides a method for reducing the total cost incurred $C_T$ for consumption of digital supercomputer resources by reducing the number N of candidate solution evaluations performed by the digital supercomputer. At 305, the found value for the candidate solution to the problem that satisfies at least one solution criterion is returned by the digital computing system.

Depending on the nature of the problem being solved and/or on the nature of the algorithms being employed, in some instances it may be advantageous to, for at least one iteration (excluding the first iteration), provide feedback to the quantum computing system from the digital computing system. The feedback may be based on the evaluation of the candidate solution to the problem by the digital computing system at act 303, where feedback from an $i^{th}$ iteration, or instant iteration, may influence generating a candidate solution to the problem by the quantum computing system (i.e., act 302) in an $(i+1)^{th}$ iteration, or next iteration.

At act 302, each iteration of generating a candidate solution to the problem by the quantum computing system may include, for example, generating multiple candidate solutions to the problem by the quantum computing system and selecting a candidate solution to the problem from the multiple candidate solutions to the problem by the digital computing system. Selecting a candidate solution to the problem from the multiple candidate solutions to the problem by the digital computing system may include, for example, selecting a candidate solution to the problem that occurs most frequently among the multiple candidate solutions to the problem by the digital computing system, as described in US Patent Application Publication 2012-0023053 (now U.S. Pat. No. 8,494,993).

As described previously and in more detail below, the problem may include optimizing a function based on at least one input parameter. In such a case, generating a candidate solution to the problem by the quantum computing system may include generating a candidate value for at least one input parameter by the quantum computing system, and evaluating the candidate solution to the problem by the digital computing system may include evaluating the function based on the candidate value for at least one input parameter by the digital computing system.

Figure 4:
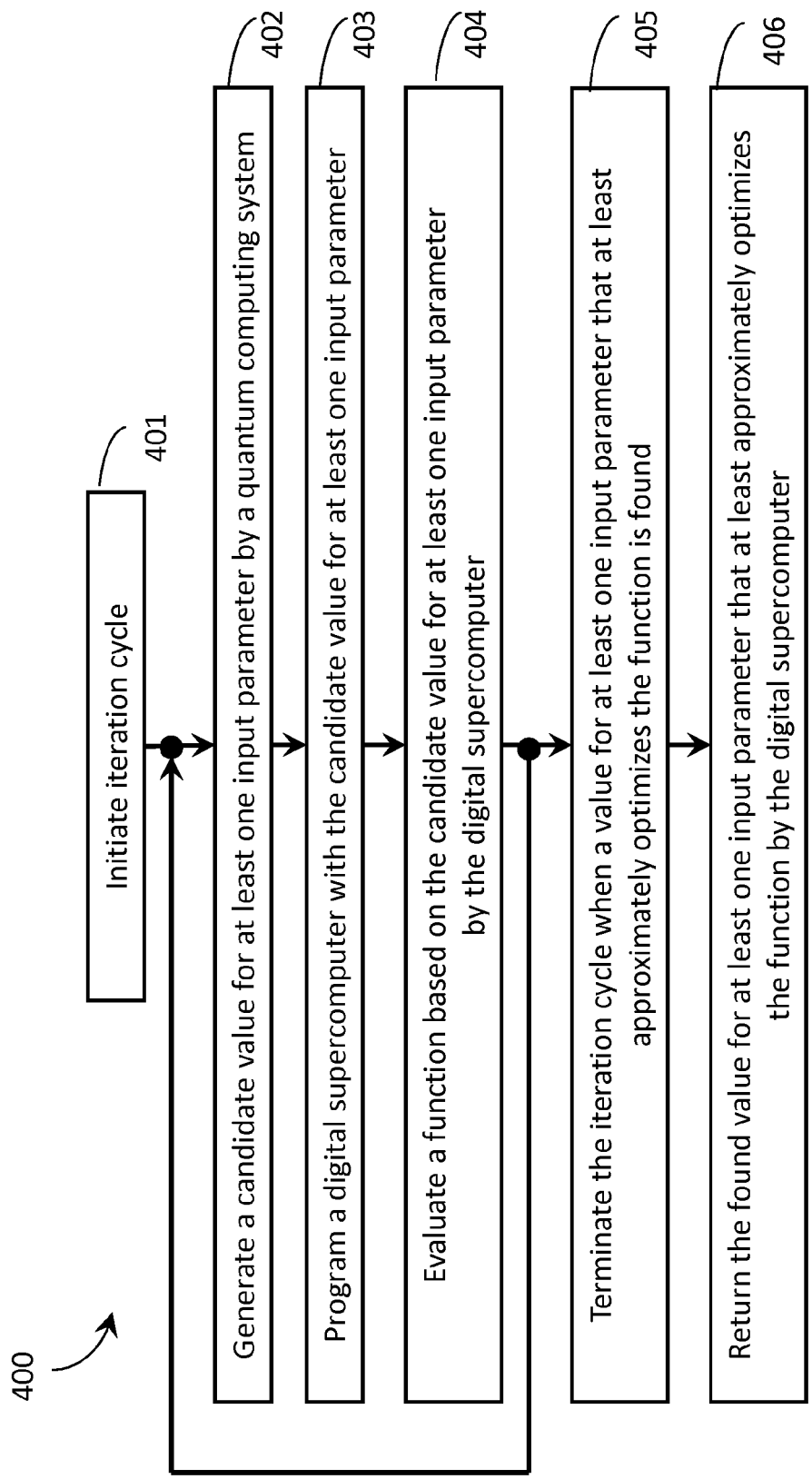
FIG. 4 is a flow-diagram showing a method of operating both a quantum computing system and a digital supercomputer to at least approximately optimize a function based on at least one input parameter in accordance with the present systems and methods.

FIG. 4 is a flow-diagram showing a method 400 of operating both a quantum computing system and a digital supercomputer to at least approximately optimize a function based on at least one input parameter in accordance with the present systems and methods. Method 400 includes six acts 401-406, though those of skill in the art will appreciate that in alternative embodiments certain acts may be omitted and/or additional acts may be added. Those of skill in the art will appreciate that the illustrated order of the acts is shown for exemplary purposes only and may change in alternative embodiments.

At 401, an iteration cycle is initiated. The iteration cycle may continue for any number N of iterations including millions of iterations, thousands of iterations, fewer than 1000 iterations, fewer than 100 iterations, and/or fewer than 10 iterations. Acts 402, 403, and 404 are completed for each iteration. At 402, a candidate value for at least one input parameter is generated by the quantum computing system. Generating a candidate value for at least one input parameter by the quantum computing system may include performing at least one of adiabatic quantum computation and/or quantum annealing by the quantum computing system. Depending on the nature of the function being optimized and/or on the nature of the algorithms being employed, generating a candidate value for at least one input parameter by the quantum computing system may include generating a candidate value for a single input parameter by the quantum computing system or generating respective candidate values for multiple input parameters by the quantum computing system. At 403, the digital supercomputer is programmed with the candidate value(s) for at least one input parameter from act 402. Programming the digital supercomputer with the candidate value(s) from act 402 may include "calling" the digital supercomputer from the quantum computing system (e.g., transmitting the candidate value(s) from act 402 to the digital supercomputer by a communicative connection between the digital supercomputer and the quantum computing system, including but not limited to: a direct electrical connection, a wireless connection, a remote connection, and/or an Internet connection). At 404, the digital supercomputer is used to evaluate the function to be optimized based on the candidate value(s) for at least one input parameter from act 402. Each evaluation of the function by the digital supercomputer (i.e., each iteration of act 404) may have a "cost incurred per call" C for consumption of digital supercomputer resources. The "total cost incurred" $C_T$ for consumption of digital supercomputer resources is then given by $C_T$=N*C, where N is the number of iterations.

At 405, the iteration cycle is terminated when a value for at least one input parameter that at least approximately optimizes the function is found. As previously described, the number of calls to the digital supercomputer from the quantum computing system (i.e., the number of iterations) is dependent on a rate of convergence of the quantum computing system. In accordance with the present systems and methods, the quantum computing system may provide a rate of convergence that is greater than a rate of convergence of the digital supercomputer, such that using the quantum computing system to generate candidate values for at least one input parameter at act 402 can significantly reduce the total number of iterations required and thereby reduce the total cost incurred $C_T$ for consumption of digital supercomputer resources. At 406, the found value for at least one input parameter that at least approximately optimizes the function is returned by the digital supercomputer.

In a similar way to that described for method 300, method 400 may also include, for at least one iteration (excluding the first iteration), providing feedback to the quantum computing system from the digital supercomputer based on evaluating the function by the digital supercomputer at act 404. Feedback from an $i^{th}$ iteration may influence generating a candidate value for at least one input parameter by the quantum computing system at act 402 in an $(i+1)^{th}$ iteration. Each iteration of generating a candidate value for at least one input parameter by the quantum computing system may include, for example, generating multiple candidate values for the at least one input parameter by the quantum computing system and selecting a candidate value for the at least one input parameter from the multiple candidate values for the at least one input parameter by a digital computing system (e.g., the digital supercomputer). Selecting a candidate value for the at least one input parameter from the multiple candidate values for the at least one input parameter may include, for example, selecting a candidate value for the at least one input parameter that occurs most frequently among the multiple candidate values for the at least one input parameter by the digital computing system, as described in US Patent Application Publication 2012-0023053 (now U.S. Pat. No. 8,494,993). Depending on the nature of the function being optimized and/or on the nature of the algorithms being employed, generating a candidate value for at least one input parameter by the quantum computing system may include generating respective candidate values for multiple input parameters by the quantum computing system.

As described previously and in more detail below, the present systems and methods describe optimizing the use of a digital supercomputer in optimizing a function.

Figure 5:
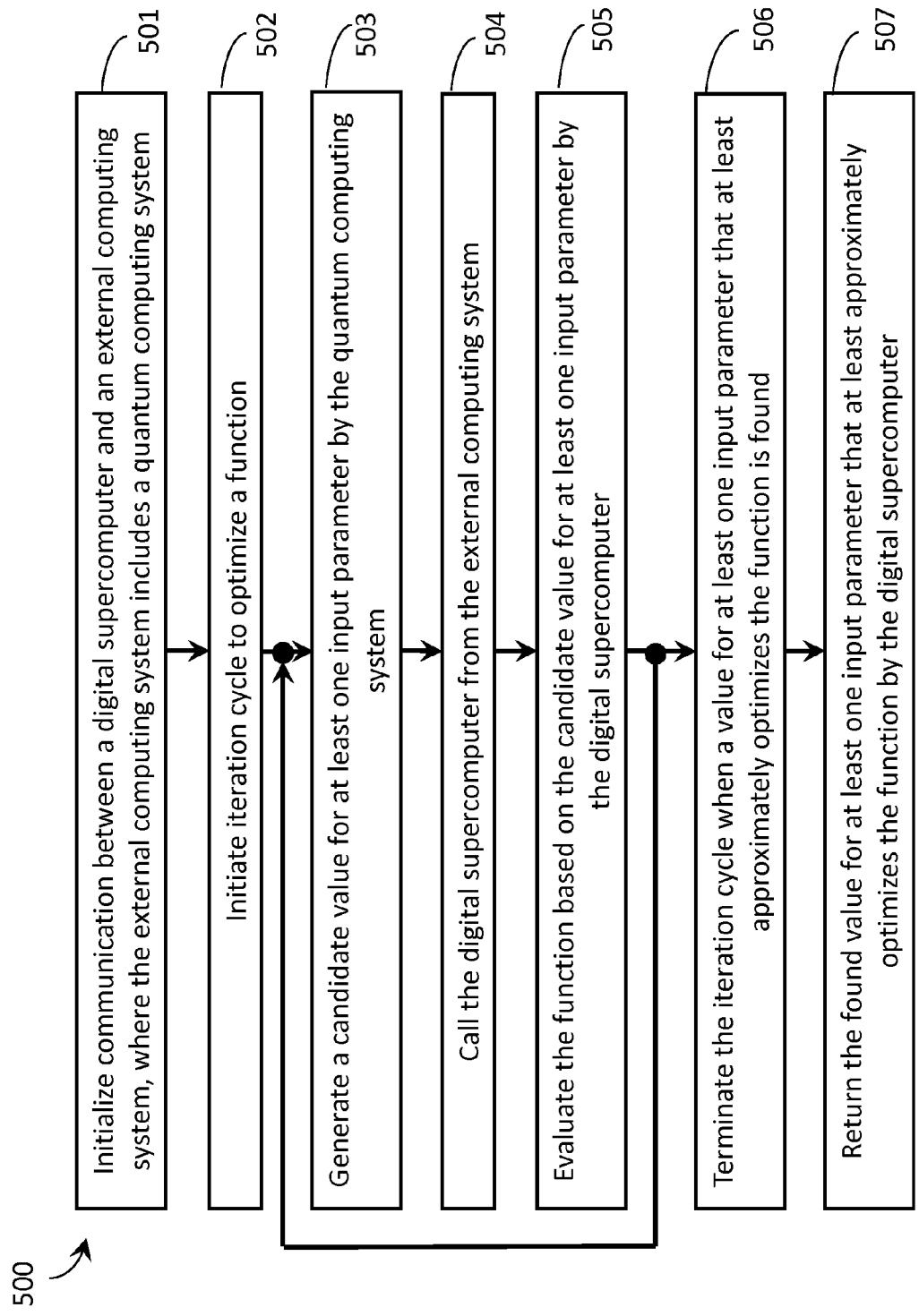
FIG. 5 is a flow-diagram showing an exemplary method of minimizing a total cost incurred $C_T$ for consumption of digital supercomputer resources when a digital supercomputer is employed to optimize a function in accordance with the present systems and methods.

FIG. 5 is a flow-diagram showing an exemplary method 500 of minimizing a total cost incurred $C_T$ for consumption of digital supercomputer resources when a digital supercomputer is employed to optimize a function in accordance with the present systems and methods. In this example, the digital supercomputer evaluates the function based on at least one input parameter in response to a call from an external computing system. Each call to the digital supercomputer from the external computing system has a cost incurred per call C for consumption of digital supercomputer resources. Method 500 includes seven acts 501-507, though those of skill in the art will appreciate that in alternative embodiments certain acts may be omitted and/or additional acts may be added. Those of skill in the art will appreciate that the illustrated order of the acts is shown for exemplary purposes only and may change in alternative embodiments. At 501, communication between the digital supercomputer and the external computing system is established, where the external computing system includes a quantum computing system. This communication may be through any known communicative means, including but not limited to: a direct electrical connection, a wireless connection, a remote connection, and/or an Internet connection. At 502, an iteration cycle is initiated to optimize a function. The iteration cycle may continue for any number N of iterations including millions of iterations, thousands of iterations, fewer than 1000 iterations, fewer than 100 iterations, and/or fewer than 10 iterations. The iteration cycle comprises acts 503-505, which are completed for each iteration.

At 503, a candidate value for at least one input parameter is generated by the quantum computing system (i.e., by the quantum computing system component of the external computing system). Generating a candidate value for at least one input parameter by the quantum computing system may include performing at least one of adiabatic quantum computation and/or quantum annealing by the quantum computing system. At 504, the digital supercomputer is called from the external computing system. Calling the digital supercomputer from the external computing system may include transmitting the candidate value for at least one input parameter from the quantum computing system to the digital supercomputer. The transmitting may be by a communication channel established between the digital supercomputer and the external computing system at act 501. For example, by a direct electrical connection, a wireless connection, a remote connection, and/or an Internet connection. At 505, the function is evaluated by the digital supercomputer based on the candidate value for at least one input parameter. As previously described, each call to the digital supercomputer from the external computing system has a cost incurred per call C for consumption of digital supercomputer resources.

At 506, the iteration cycle is terminated when a value for at least one input parameter that at least approximately optimizes the function is found. At this point, the iteration cycle will have completed N iterations. The total cost incurred $C_T$ for consumption of digital supercomputer resources is equal to the number N of calls to the digital supercomputer from the external computing system multiplied by the cost incurred per call C such that $C_T=N*C$. The number N of calls to the digital supercomputer from the external computing system is dependent on a rate of convergence of the quantum computing system, and in accordance with the present systems and methods, the rate of convergence of the quantum computing system is greater than a rate of convergence of the digital supercomputer such that the number N of calls to the digital supercomputer from the external computing system is minimized. Minimizing the number N of calls to the digital supercomputer by generating candidate values by the quantum computing system and taking advantage of the quantum computing system's greater rate of convergence achieves the minimization of the total cost incurred $C_T$ for consumption of digital supercomputer resources. At 507, the found value for at least one input parameter that at least approximately optimizes the function is returned by the digital supercomputer.

In a similar way to that described for methods 300 and 400, method 500 may also include, for at least one iteration (excluding the first iteration), providing feedback to the external computing system from the digital supercomputer based on evaluating the function by the digital supercomputer at act 505. Feedback from an $i^{th}$ iteration may influence generating a candidate value for at least one input parameter by the quantum computing system at act 503 in an $(i+1)^{th}$ iteration. Each iteration of generating a candidate value for at least one input parameter by the quantum computing system may include, for example, generating multiple candidate values for the at least one input parameter by the quantum computing system and selecting a candidate value for the at least one input parameter from the multiple candidate values for the at least one input parameter by the external computing system (e.g., by a digital computing component of the external computing system). Selecting a candidate value for the at least one input parameter from the multiple candidate values for the at least one input parameter may include, for example, selecting a candidate value for the at least one input parameter that occurs most frequently among the multiple candidate values for the at least one input parameter by the external computing system, as described in US Patent Application Publication 2012-0023053 (now U.S. Pat. No. 8,494,993). Depending on the nature of the function being optimized and/or on the nature of the algorithms being employed, generating a candidate value for at least one input parameter by the quantum computing system may include generating respective candidate values for multiple input parameters by the quantum computing system.

Methods 300, 400, and 500 are generally directed towards operating both a digital computing system (e.g., a digital supercomputer) and a quantum computing system, or a "hybrid system" comprising both a digital computing system (e.g., a digital supercomputer) and a quantum computing system. Further details of such a hybrid system are now described.

Figure 6:
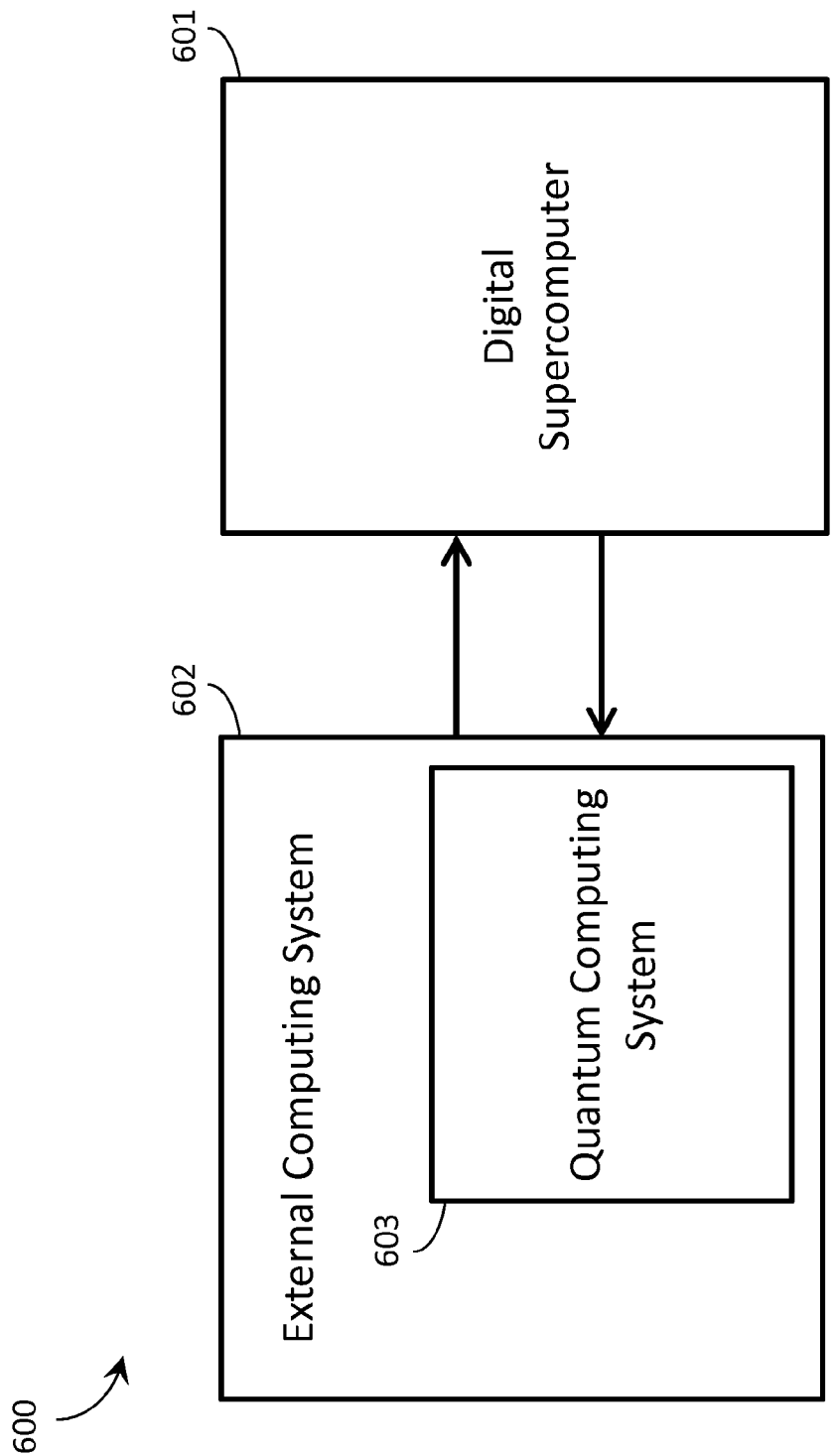
FIG. 6 is a schematic diagram of a hybrid computing system in accordance with the present systems and methods.

FIG. 6 is a schematic diagram of a hybrid computing system 600 in accordance with the present systems and methods. Hybrid computing system 600 includes a digital computing system in the form of digital supercomputer 601 that is communicatively coupled to an external computing system 602. External computing system 602 includes a quantum computing system 603. Communicative coupling between digital supercomputer 601 and external computing system 602 may be through any known means of communication, including but not limited to: a direct electrical connection, a wireless connection, a remote connection, and an Internet connection. Quantum computing system 603 may include a quantum processor. For example, quantum computing system 603 may include a superconducting quantum processor designed to perform adiabatic quantum computation and/or quantum annealing with superconducting flux qubits and superconducting coupling devices, such as superconducting quantum processor 100 from FIG. 1.

Throughout this specification and the appended claims, the term "external computing system" is generally used to describe a first computing system that is physically and/or programmatically separate from a second computing system. An external computing system is frequently described herein as including a quantum computing system; however, unless the specific context requires otherwise, an external computing may include a digital computing system either in addition to or instead of a quantum computing system.

In accordance with the present systems and methods, hybrid computing system 600 may optimize a function based on at least one input parameter. Quantum computing system 603 may have a first rate of convergence, and quantum computing system 603 may generate candidate values for the at least one input parameter. Digital supercomputer 601 may have a second rate of convergence, and digital supercomputer 601 may evaluate the function based on the at least one input parameter generated by quantum computing system 603. In this way, for N iterations, quantum computing system 603 may generate candidate values for the at least one input parameter and call digital supercomputer 601 (i.e., transmit the candidate values to digital supercomputer 6601) to evaluate the function based on the candidate values for the at least one input parameter. The final iteration (i.e., the $N^{th}$ iteration) is reached when a value for the at least one input parameter that at least approximately optimizes the function is found. The number N of calls to digital supercomputer 601 from quantum computing system 603 is dependent on the first rate of convergence of quantum computing system 603. In accordance with the present systems and methods, the first rate of convergence of quantum computing system 603 is greater than the second rate of convergence of digital supercomputer 601 such that the number N of calls to digital supercomputer 601 from quantum computing system 603 is minimized. In response to finding the value for the at least one input parameter that at least approximately optimizes the function, digital supercomputer 601 returns the found value for the at least one input parameter that at least approximately optimizes the function.

The present systems and methods describe interactions between quantum computing systems and digital computing systems. For example, the present systems and methods describe interactions between quantum processors (such as superconducting quantum processors) and digital processors. The total computation time required for operations that involve interactions between a quantum processor and a digital processor depends on at least three factors: the computation time of the quantum processor, the computation time of the digital processor, and the communication time for interactions between the quantum processor and the digital processor. In some applications, the communication time for interactions between the quantum processor and the digital processor may be a significant contributor to the overall computation time (e.g., representing about 1% or more of the overall computation time). The overall computation time for an operation that involves at least one interaction between a quantum processor and a digital processor may be reduced by reducing the communication time for the at least one interaction between the quantum processor and the digital processor. In accordance with the present systems and methods, the communication time for an interaction between a quantum processor and a digital processor may be reduced by implementing the digital processor as a superconducting digital processor and operating the superconducting digital processor within the same refrigerated environment as a superconducting quantum processor.

A person of skill in the art will appreciate that digital processors may also be implemented as superconducting processors. Such "superconducting digital processors" may employ similar or the same materials as those employed in superconducting quantum processors, but superconducting digital processors may be designed to process classical, digital information in a manner similar to conventional semiconducting digital processors instead of leveraging quantum mechanical effects to process quantum information in a manner similar to superconducting quantum processors. Examples of known technologies that may be employed in superconducting digital processors include single flux quantum technology, quantum flux parametron technology, etc.

Figure 7:
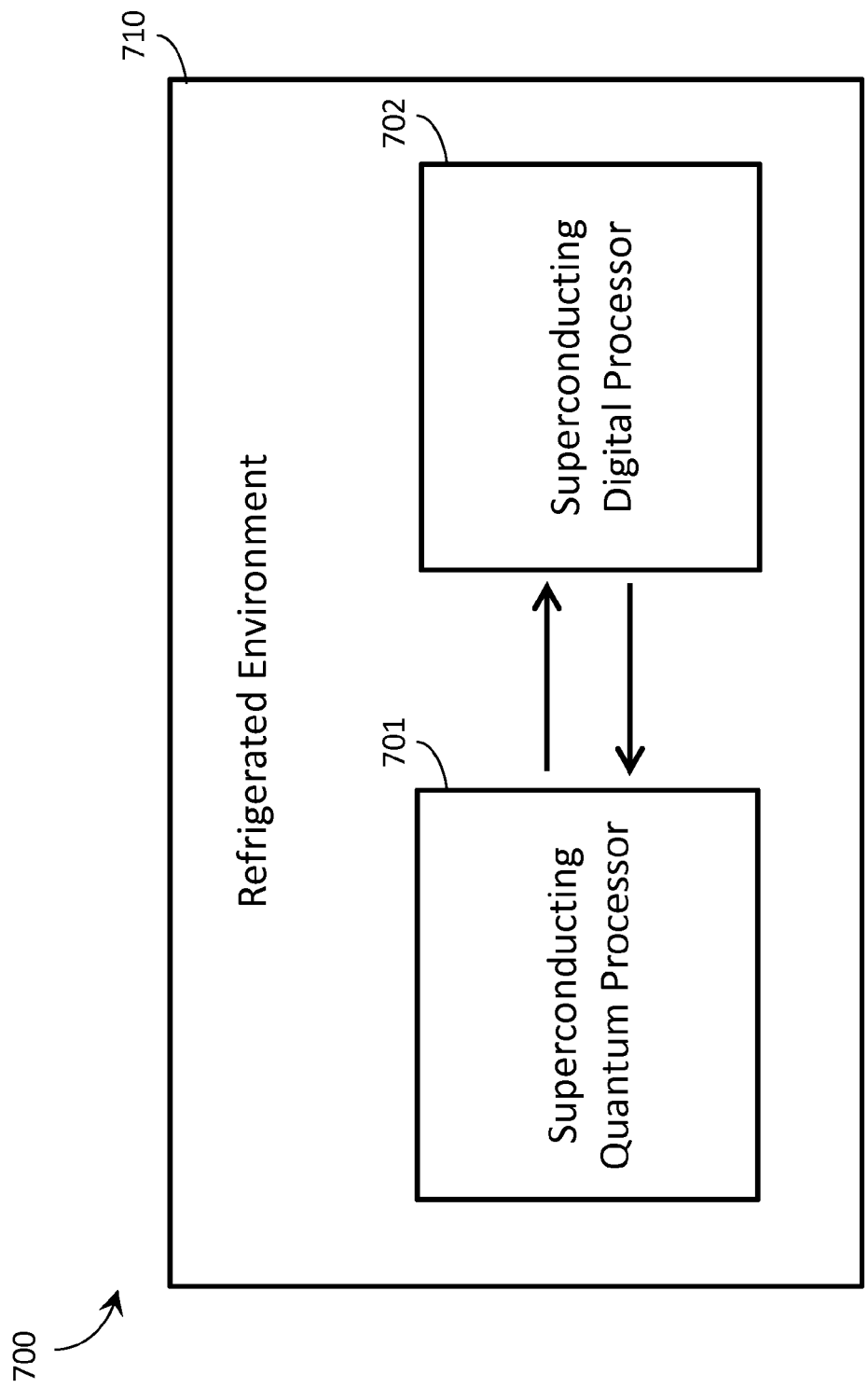
FIG. 7 is a schematic diagram of a hybrid computing system employing both a superconducting quantum processor and a superconducting digital processor within the same refrigerated environment in accordance with the present systems and methods.

FIG. 7 is a schematic diagram of a hybrid computing system 700 employing both a superconducting quantum processor 701 and a superconducting digital processor 702 within the same refrigerated environment 710 in accordance with the present systems and methods. Superconducting quantum processor 701 may, for example, be substantially similar to superconducting quantum processor 100 from FIG. 1 and superconducting digital processor 702 may employ single flux quantum logic to implement classical, digital information processing. With both superconducting quantum processor 701 and superconducting digital processor 702 housed within the same refrigerated environment 710, latency time for communications/interactions between superconducting quantum processor 701 and superconducting digital processor 702 is significantly reduced compared to a system in which the digital processor is stored outside of refrigerated environment 710. For example, communication between superconducting quantum processor 701 and superconducting digital processor 702 may be through superconducting communication channels.

Refrigerated environment 710 may include a cryogenic environment provided by at least one of a liquid cryogen bath (e.g., a bath of liquid nitrogen or liquid helium), a cryocooler (e.g., a pulse tube cryocooler), a dilution refrigerator, and/or any combination thereof. Exemplary systems and methods for cooling superconducting processors are described in, for example, US Patent Application Publication 2010-0281885 (now U.S. Pat. No. 8,464,542).

In accordance with the present systems and methods, external computing system 602 from hybrid computing system 600 of FIG. 6 may include both a superconducting quantum processor and a superconducting digital processor, e.g., housed within the same refrigerated environment. In other words, external computing system 602 from FIG. 6 may include hybrid computing system 700 from FIG. 7. Such may be particularly advantageous when external computing system 602 is used to perform computational tasks that involve both quantum processing and digital processing components. For example, external computing system 602 may generate candidate values for at least one input parameter of an objective function by employing hybrid system 700 to perform the sampling processes described in U.S. patent application Ser. No. 13/806,404 (now US Patent Application Publication 2013-0282636) where the overall computation time of such sampling processes may be reduced by performing the digital processing tasks by superconducting digital processor 702 that is housed within the same refrigerated environment 710 as superconducting quantum processor 701.

Quantum annealing is used throughout this specification and the appended claims as a non-limiting example of a quantum algorithm that may be implemented by a quantum processor in a quantum computing system in order to determine candidate solutions, generate values, and/or optimize functions. A person of skill in the art will appreciate that a large number of classical (i.e., "non-quantum") algorithms exist for performing similar tasks. An example of such a classical algorithm is simulated annealing. In many applications, quantum annealing may outperform (i.e., return a better solution in the same amount of time, return a comparable solution is less time, or return a better solution in less time) simulated annealing. However, depending on the specifics of the problem instance, in some applications simulated annealing may outperform quantum annealing. In accordance with the present systems and methods, the best result to a problem may be obtained by performing both quantum annealing by a quantum processor and simulated annealing (or any other classical heuristic optimization technique) by a digital processor (including a superconducting digital processor) and returning the better of the two solutions obtained as the result.

For example, a hybrid computing system employing both quantum computational and digital computational resources (such as, but not limited to, hybrid computing system 600 from FIG. 6 and/or hybrid computing system 700 from FIG. 7) may be used to perform both quantum annealing by the quantum computational resources and simulated annealing by the digital computational resources to produce two respective candidate solutions. The two candidate solutions may then be compared (e.g., by the digital computational resources or by a separate digital computing system) and the candidate solution that best satisfies some solution criterion may be returned as the result.

Throughout this specification and the appended claims, reference is often made to "at least one solution criterion" and/or "solution criteria." A solution criterion may include, for example, a characteristic of a candidate solution that is evaluated and used to determine the quality of that candidate solution, such as a minimum/maximum acceptable objective function value. Other examples of solution criteria include a minimum/maximum number of iterations, a minimum/maximum computation time, etc.

In accordance with the present systems and methods, interactions between quantum computational resources and digital computational resources may benefit from the security afforded by quantum encryption techniques. In other words, a quantum computer may be programmed by a quantum secured channel. For example, quantum key distribution may be employed to establish symmetric private keys between a digital computing system and a programming subsystem of a quantum computing system. The symmetric private keys may then be used to encrypt the programming information for the quantum processor (e.g., encrypt the $h_i$ and $J_{ij}$ values described in the context of quantum processor 100 from FIG. 1). The encrypted keys may be distributed over an insecure channel while the quantum encryption ensures the encrypted programming information remains secure. Upon receipt of the encrypted programming information, the programming subsystem of the quantum computing system may use the symmetric private keys to decrypt the programming information, run the quantum computation, and the result may be encrypted using the same quantum encryption technique before being sent back to digital computing system from which the encrypted programming information originated.

As an extension of the above concept, in accordance with the present systems and methods a quantum processor may be used to perform quantum computation within an encrypted basis. For example, a quantum processor that performs adiabatic quantum computation and/or quantum annealing may be programmed with a problem Hamiltonian that has the same ground state configuration as another "target" Hamiltonian but with very different $h_i$ and $J_{ij}$ values. In this scenario, the actual problem of interest may be represented by the target Hamiltonian but the computation may be run using the problem Hamiltonian, such that the solution obtained is relevant to the target Hamiltonian but the target Hamiltonian itself effectively remains undisclosed, and therefore secure.

Figure 8:
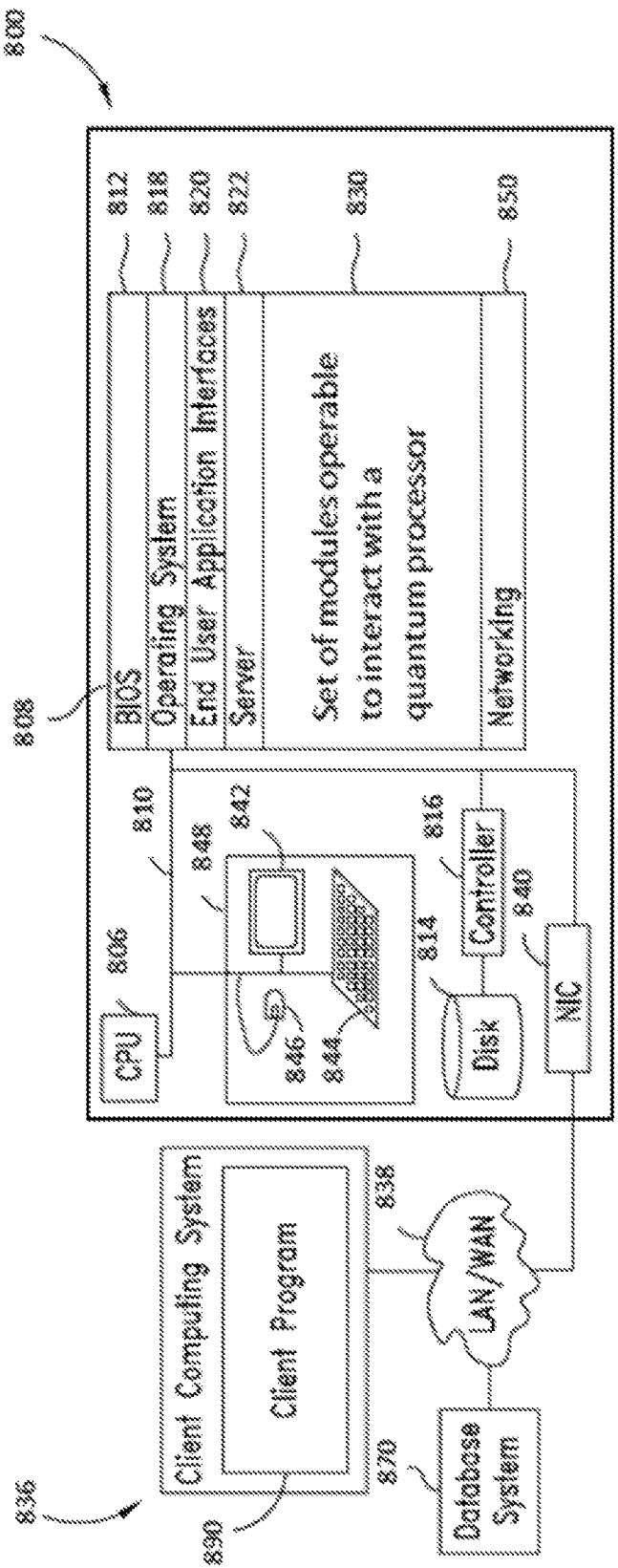
FIG. 8 illustrates an exemplary digital computing system including a digital processor that may be used to perform classical digital processing tasks described in the present systems and methods.

FIG. 8 illustrates an exemplary digital computing system 800 including a digital processor 806 that may be used to perform classical digital processing tasks described in the present systems and methods. Those skilled in the relevant art will appreciate that the present systems and methods can be practiced with other digital computer configurations, including hand-held devices, multiprocessor systems, microprocessor-based or programmable consumer electronics, personal computers ("PCs"), network PCs, mini-computers, mainframe computers, and the like. The present systems and methods can also be practiced in distributed computing environments, where tasks or modules are performed by remote processing devices, which are linked through a communications network. In a distributed computing environment, program modules may be located in both local and remote memory storage devices.

Digital computing system 800 may include at least one processing unit 806 (i.e., digital processor), at least one system memory 808, and at least one system bus 810 that couples various system components, including system memory 808 to digital processor 806. Digital computing system 800 will at times be referred to in the singular herein, but this is not intended to limit the application to a single digital computer 800. For example, there may be more than one digital computing system 800 or other classical computing device involved throughout the present systems and methods.

Digital processor 806 may be any logic processing unit, such as one or more central processing units ("CPUs"), digital signal processors ("DSPs"), application-specific integrated circuits ("ASICs"), etc. Unless described otherwise, the construction and operation of the various blocks shown in FIG. 8 are of conventional design. As a result, such blocks need not be described in further detail herein, as they will be understood by those skilled in the relevant art.

System bus 810 can employ any known bus structures or architectures, including a memory bus with a memory controller, a peripheral bus, and a local bus. System memory 808 may include non-volatile memory such as read-only memory ("ROM") and volatile memory such as random access memory ("RAM") (not shown). A basic input/output system ("BIOS") 812, which can form part of the ROM, contains basic routines that help transfer information between elements within digital computing system 800, such as during startup.

Digital computing system 800 may also include other non-volatile memory 814. Non-volatile memory 814 may take a variety of forms, including: a hard disk drive for reading from and writing to a hard disk, an optical disk drive for reading from and writing to removable optical disks, and/or a magnetic disk drive for reading from and writing to magnetic disks. The optical disk can be a CD-ROM or DVD, while the magnetic disk can be a magnetic floppy disk or diskette. Non-volatile memory 814 may communicate with digital processor 806 by system bus 810 and may include appropriate interfaces or controllers 816 coupled between non-volatile memory 814 and system bus 810. Non-volatile memory 814 may serve as long-term storage for computer-readable instructions, data structures, program modules and other data for digital computing system 800. Although digital computing system 800 has been described as employing hard disks, optical disks and/or magnetic disks, those skilled in the relevant art will appreciate that other types of non-volatile computer-readable media may be employed, such a magnetic cassettes, flash memory cards, Bernoulli cartridges, Flash, ROMs, smart cards, etc.

Various program modules, application programs and/or data can be stored in system memory 808. Herein a module is a collection of processor readable and executable instructions. For example, system memory 808 may store an operating system 818, end user application interfaces 820 and server applications 822. In accordance with the present systems and methods, system memory 808 may store at set of modules 830 operable to interact with a quantum processor (not shown in FIG. 8). Throughout this specification and the appended claims, the digital processing portion of the various interactions between digital computational resources and quantum computational resources may be completed through modules 830.

System memory 808 may also include one or more networking applications 850, for example, a Web server application and/or Web client or browser application for permitting digital computing system 800 to exchange data with sources by the Internet, corporate Intranets, or other networks, as well as with other server applications executing on server computers. Networking application 850 in the depicted embodiment may be markup language based, such as hypertext markup language ("HTML"), extensible hypertext markup language ("XHTML"), extensible markup language ("XML") or wireless markup language ("WML"), and may operate with markup languages that use syntactically delimited characters added to the data of a document to represent the structure of the document. A number of Web server applications and Web client or browser applications are commercially available, such as those available from Mozilla and Microsoft.

While shown in FIG. 8 as being stored in system memory 808, operating system 818 and various applications/modules 820, 822, 830, 850 and other data can also be stored in nonvolatile memory 814.

Digital computing system 800 can operate in a networking environment using logical connections to at least one client computer system 836 and at least one database system 870. These logical connections may be formed using any means of digital communication, for example, through a network 838, such as a local area network ("LAN") or a wide area network ("WAN") including, for example, the Internet. The networking environment may include wired or wireless enterprise-wide computer networks, intranets, extranets, and/or the Internet. Other embodiments may include other types of communication networks such as telecommunications networks, cellular networks, paging networks, and other mobile networks. The information sent or received by the logical connections may or may not be encrypted. When used in a LAN networking environment, digital computing system 800 may be connected to the LAN through an adapter or network interface card ("NIC") 840 (communicatively linked to system bus 810). When used in a WAN networking environment, digital computing system 800 may include an interface and modem (not shown), or a device such as NIC 840, for establishing communications over the WAN. Non-networked communications may additionally, or alternatively be employed.

In a networked environment, program modules, application programs, data, or portions thereof can be stored outside of digital computing system 800. Those skilled in the relevant art will recognize that the logical connections shown in FIG. 8 are only some examples of establishing communications between computers, and other connections may also be used.

While digital computing system 800 may generally operate automatically, an end user application interface 820 may also be provided such that an operator can interact with digital computing system 800 through different user interfaces 848, including output devices, such as a monitor 842, and input devices, such as a keyboard 844 and a pointing device (e.g., mouse 846). Monitor 842 may be coupled to system bus 810 by a video interface, such as a video adapter (not shown). Digital computing system 800 can also include other output devices, such as speakers, printers, etc. Other input devices can also be used, including a microphone, joystick, scanner, etc. These input devices may be coupled to digital processor 806 by a serial port interface that couples to system bus 810, a parallel port, a game port, a wireless interface, a universal serial bus ("USB") interface, or by other interfaces.

NIC 840 may include appropriate hardware and/or software for interfacing with the elements of a quantum processor (not shown). In other embodiments, different hardware may be used to facilitate communications between digital computing system 800 and a quantum processor. For example, digital computing system 800 may communicate with a quantum processor by a direct electrical connection (e.g., by Universal Serial Bus, Firewire, or the like), a wireless connection (e.g., by a Wi-Fi® network), or an Internet connection.

Client computer system 836 may comprise any of a variety of computing devices communicatively coupled to digital computing system 800, and may include a client program 890 configured to properly format and send problems directly or indirectly to server application 822. Once digital computing system 800 has determined a solution, server application 822 may be configured to send information indicative of this solution back to client program 890.

In some embodiments, the quantum processor, such as shown in FIG. 1 may be coupled via NIC 840, is included a hybrid computing system. A hybrid computing system may be summarized as including a cryogenic refrigeration system that provides a refrigerated environment; a superconducting quantum processor positioned within the refrigerated environment and cooled by the cryogenic refrigeration system; and a superconducting digital processor positioned within the refrigerated environment and cooled by the cryogenic refrigeration system, where the superconducting digital processor is superconductively coupled to the superconducting quantum processor.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other methods of quantum computation, not necessarily the exemplary methods for quantum computation generally described above.

The various embodiments described above can be combined to provide further embodiments. All of the U.S. patents, U.S. patent application publications, U.S. patent applications, International (PCT) patent applications referred to in this specification and/or listed in the Application Data Sheet, including U.S. provisional application Ser. No. 61/811,457, are incorporated herein by reference, in their entirety. Aspects of the embodiments can be modified, if necessary, to employ systems, circuits and concepts of the various patents, applications and publications to provide yet further embodiments.

While described in terms of digital supercomputers, some implementations may employ more standard digital computers. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of minimizing a total cost incurred for consumption of digital supercomputer resources when a digital supercomputer is employed to optimize a function, wherein the digital supercomputer evaluates the function in response to a call from an external computing system, each call to the digital supercomputer from the external computing system having a cost incurred per call, the method comprising:

initializing communication between the digital supercomputer and the external computing system, wherein the external computing system includes a quantum computing system;

optimizing the function, wherein optimizing the function comprises, for a plurality of iterations:

generating a candidate value for at least one input parameter by the quantum computing system, transmitting, in a respective call, the candidate value for at least one input parameter from the quantum computing system to the digital supercomputer, and evaluating the function based on the candidate value for at least one input parameter by the digital supercomputer, until a value for at least one input parameter that at least approximately optimizes the function is found, wherein the number of iterations in the plurality of iterations is dependent on a rate of convergence of the quantum computing system, and wherein the rate of convergence of the quantum computing system is greater than a rate of convergence of the digital supercomputer such that the number of iterations is minimized, and wherein the total cost incurred is minimized; and in response to finding the value for at least one input parameter that at least approximately optimizes the function:

stopping the iteration, and returning the found value for at least one input parameter that at least approximately optimizes the function by the digital supercomputer.

2. The method of claim 1 wherein generating a candidate value for at least one input parameter by the quantum computing system includes performing at least one of adiabatic quantum computation and quantum annealing by the quantum computing system.

3. The method of claim 1 wherein transmitting the candidate value for at least one input parameter from the quantum computing system to the digital supercomputer includes transmitting the candidate value for at least one input parameter from the quantum computing system to the digital supercomputer by at least one of: a direct electrical connection, a wireless connection, a remote connection, or an Internet connection.

4. The method of claim 1 wherein the number of iterations in the plurality iterations is greater than one, and optimizing the function further comprises, for at least one iteration:

providing feedback to the external computing system from the digital supercomputer based on evaluating the function based on the candidate value for at least one input parameter by the digital supercomputer, wherein feedback from an current one of the iterations influences generating a candidate value for at least one input parameter by the quantum computing system in a next one of the iterations.

5. The method of claim 4 wherein the number of iterations in plurality iterations is upper bounded by a value selected from a group consisting of: 1000, 100, and 10.

6. The method of claim 4 wherein generating a candidate value for at least one input parameter by the quantum computing system includes generating multiple candidate values for the at least one input parameter by the quantum computing system, and further comprising, for each iteration of the plurality of iterations:

selecting a candidate value for the at least one input parameter from the multiple candidate values for the at least one input parameter by the external computing system.

7. The method of claim 6 wherein selecting a candidate value for the at least one input parameter from the multiple candidate values for the at least one input parameter by the external computing system includes selecting a candidate value for the at least one input parameter that occurs most frequently among the multiple candidate values for the at least one input parameter by the external computing system.

8. The method of claim 1 wherein generating a candidate value for at least one input parameter by the quantum computing system includes generating respective candidate values for multiple input parameters by the quantum computing system.

9. A hybrid computing system that optimizes a function based on at least one input parameter, the hybrid computing system comprising:

a quantum computing system that generates candidate values for the at least one input parameter, wherein the quantum computing system has a first rate of convergence; and a digital supercomputer that evaluates the function based on the at least one input parameter, wherein the digital supercomputer has a second rate of convergence, and wherein for a plurality of iterations:

the quantum computing system generates a candidate value for the at least one input parameter, the quantum computing system calls the digital supercomputer to transmit the candidate value for the at least one input parameter to the digital supercomputer, and the digital supercomputer evaluates the function based on the candidate value for the at least one input parameter, until a value for the at least one input parameter that at least approximately optimizes the function is found, wherein the number of calls to the digital supercomputer from the quantum computing system is dependent on the first rate of convergence of the quantum computing system, and wherein the first rate of convergence of the quantum computing system is greater than the second rate of convergence of the digital supercomputer such that the number of calls to the digital supercomputer from the quantum computing system is minimized; and in response to finding the value for the at least one input parameter that at least approximately optimizes the function:

the digital supercomputer returns the found value for the at least one input parameter that at least approximately optimizes the function.

10. The hybrid computing system of claim 9 wherein the quantum computing system includes a superconducting quantum processor, and wherein the quantum computing system generates candidate values for the at least one input parameter by at least one of adiabatic quantum computation and quantum annealing.

11. The hybrid computing system of claim 9 wherein the quantum computing system and the digital supercomputer are communicatively coupleable by at least one of a direct electrical connection, a wireless connection, a remote connection, and an Internet connection.

12. A method of operating both a quantum computing system and a digital supercomputer to at least approximately optimize a function based on at least one input parameter, the method comprising:

for a number of iterations:

generating a candidate value for at least one input parameter by the quantum computing system;

programming the digital supercomputer with the candidate value for at least one input parameter; and evaluating the function based on the candidate value for at least one input parameter by the digital supercomputer, until a value for at least one input parameter that at least approximately optimizes the function is found, wherein the number of iterations is dependent on a rate of convergence of the quantum computing system, and wherein the rate of convergence of the quantum computing system is greater than a rate of convergence of the digital supercomputer; and in response to finding a value for at least one input parameter that at least approximately optimizes the function:
  stopping the iteration; and
  returning the found value for at least one input parameter that at least approximately optimizes the function by the digital supercomputer.

13. The method of claim 12 wherein generating a candidate value for at least one input parameter by the quantum computing system includes performing at least one of adiabatic quantum computation and quantum annealing by the quantum computing system.

14. The method of claim 12, further comprising:
for at least one iteration:
  providing feedback to the quantum computing system from the digital supercomputer based on evaluating the function based on the candidate value for at least one input parameter by the digital supercomputer, wherein feedback from an $i^{th}$ iteration influences generating a candidate value for at least one input parameter by the quantum computing system in an $(i+1)^{th}$ iteration.

15. The method of claim 14 wherein the number of iterations is selected from a group consisting of: a number less than 1000, a number less than 100, and a number less than 10.

16. The method of claim 14 wherein generating a candidate value for at least one input parameter by the quantum computing system includes generating multiple candidate values for the at least one input parameter by the quantum computing system, and further comprising, for each of the number of iterations:
  selecting a candidate value for the at least one input parameter from the multiple candidate values for the at least one input parameter by a digital computing system.

17. The method of claim 16 wherein selecting a candidate value for the at least one input parameter from the multiple candidate values for the at least one input parameter by a digital computing system includes selecting a candidate value for the at least one input parameter that occurs most frequently among the multiple candidate values for the at least one input parameter by the digital computing system.

18. The method of claim 12 wherein generating a candidate value for at least one input parameter by the quantum computing system includes generating respective candidate values for multiple input parameters by the quantum computing system.

19. A method of iteratively operating a hybrid computing system to solve a problem, the hybrid computing system comprising a quantum computing system having a first rate of convergence and a digital computing system having a second rate of convergence, wherein the quantum computing system and the digital computing system are in communication with one another and the first rate of convergence of the quantum computing system is greater than the second rate of convergence of the digital computing system, the method comprising:
for a number of iterations:
  generating a candidate solution to the problem by the quantum computing system; and
  evaluating the candidate solution to the problem by the digital computing system,
until a candidate solution to the problem that satisfies at least one solution criterion is found, wherein the number of iterations is dependent on the first rate of convergence of the quantum computing system; and
in response to finding a candidate solution to the problem that satisfies at least one solution criterion:
  stopping the iteration; and
  returning the found candidate solution that satisfies at least one solution criterion by the digital computing system.

20. The method of claim 19 wherein generating a candidate solution to the problem by the quantum computing system includes performing at least one of adiabatic quantum computation and quantum annealing by the quantum computing system.

21. The method of claim 19, further comprising:
for at least one iteration:
  providing feedback to the quantum computing system from the digital computing system based on evaluating the candidate solution to the problem by the digital computing system, wherein feedback from an $i^{th}$ iteration influences generating a candidate solution to the problem by the quantum computing system in an $(i+1)^{th}$ iteration.

22. The method of claim 21 wherein the number of iterations is selected from a group consisting of: a number less than 1000, a number less than 100, and a number less than 10.

23. The method of claim 21 wherein generating a candidate solution to the problem by the quantum computing system includes generating multiple candidate solutions to the problem by the quantum computing system, and further comprising, for each of the number of iterations:
  selecting a candidate solution to the problem from the multiple candidate solutions to the problem by the digital computing system.

24. The method of claim 23 wherein selecting a candidate solution to the problem from the multiple candidate solutions to the problem by the digital computing system includes selecting a candidate solution to the problem that occurs most frequently among the multiple candidate solutions to the problem by the digital computing system.

25. The method of claim 19 wherein the problem includes optimizing a function based on at least one input parameter and wherein:
  generating a candidate solution to the problem by the quantum computing system includes generating a candidate value for at least one input parameter by the quantum computing system; and
  evaluating the candidate solution to the problem by the digital computing system includes evaluating the function based on the candidate value for at least one input parameter by the digital computing system.

* * * * *